(12) United States Patent
David et al.

(10) Patent No.: US 8,618,844 B2
(45) Date of Patent: Dec. 31, 2013

(54) LEVEL-SHIFTING INTERFACE FOR A PROCESSOR-BASED DEVICE

(75) Inventors: Thomas S. David, Austin, TX (US); Paul I. Zavalney, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 27 days.

(21) Appl. No.: 13/404,744

(22) Filed: Feb. 24, 2012

(65) Prior Publication Data

US 2013/0222035 A1 Aug. 29, 2013

(51) Int. Cl.
*H03K 3/00* (2006.01)

(52) U.S. Cl.
USPC .............................. 327/108; 327/407; 326/80

(58) Field of Classification Search
USPC .................................... 327/108, 407; 326/80
See application file for complete search history.

(56) References Cited

U.S. PATENT DOCUMENTS

| | | | |
|---|---|---|---|
| 7,728,652 B2 * | 6/2010 | Sohara et al. | 327/536 |
| 8,044,684 B1 * | 10/2011 | Monga | 326/81 |
| 8,421,516 B2 * | 4/2013 | Kumar et al. | 327/108 |

* cited by examiner

*Primary Examiner* — Kenneth B. Wells
(74) *Attorney, Agent, or Firm* — Trop, Pruner & Hu, P.C.

(57) ABSTRACT

An apparatus includes an integrated circuit, which includes an input terminal, a second terminal to communicate with circuitry external to the integrated circuit, a multiplexer, a level shifter and a processor. The multiplexer is adapted to selectively couple the input terminal, the level shifter and the second output terminal together.

17 Claims, 5 Drawing Sheets

LEVEL-SHIFTING INTERFACE FOR A PROCESSOR-BASED DEVICE

BACKGROUND

A digital logic signal typically has one of two states: a first state indicated by a low voltage of the signal, and a second state indicated by a high voltage of the signal. The ranges of voltages that distinguish high voltages from low voltages may vary among digital subsystems that communicate with each other. Therefore, a high voltage for one digital subsystem may be considered a low voltage for another digital subsystem. To allow such digital systems to communicate with each other, level shifters may be employed. In general, a level shifter is a circuit that shifts, or translates, the voltage level of an input signal to the level shifter to a different voltage level. Therefore, to allow different digital subsystems to communicate, a given level shifter may translate the voltages associated with logic states of a first digital subsystem into voltages associated with corresponding logic states of a second digital subsystem. For example, if the first digital subsystem uses a voltage range of 1.5 to 3.0 V as a high voltage for its logic signals, the level shifter may translate voltages in this range into 2.5 to 5.0 V voltages, which the second digital subsystem recognizes as high voltages.

SUMMARY

In an exemplary embodiment, a technique includes providing an integrated circuit including a processor and a driver circuit to drive a first signal to an external output terminal of the integrated circuit. The technique further includes adapting the integrated circuit is used to selectively level shift a second signal received at an external input terminal of the integrated circuit to provide a level shifted, second signal to the driver circuit.

In another exemplary embodiment, an apparatus includes an integrated circuit, which includes an input terminal, a second terminal to communicate with circuitry external to the integrated circuit, a multiplexer, a level shifter and a processor. The multiplexer is adapted to selectively couple the input terminal, the level shifter and the second terminal together.

In yet another exemplary embodiment, an apparatus includes an integrated circuit, which includes an input terminal, a second terminal to communicate with circuitry external to the integrated circuit, a multiplexer, a level shifter, and a processor. The processor is adapted to selectively configure the multiplexer to couple the input terminal, the level shifter and the second terminal together.

Advantages and other desired features will become apparent from the following drawing, description and claims.

DETAILED DESCRIPTION

Figure 1:
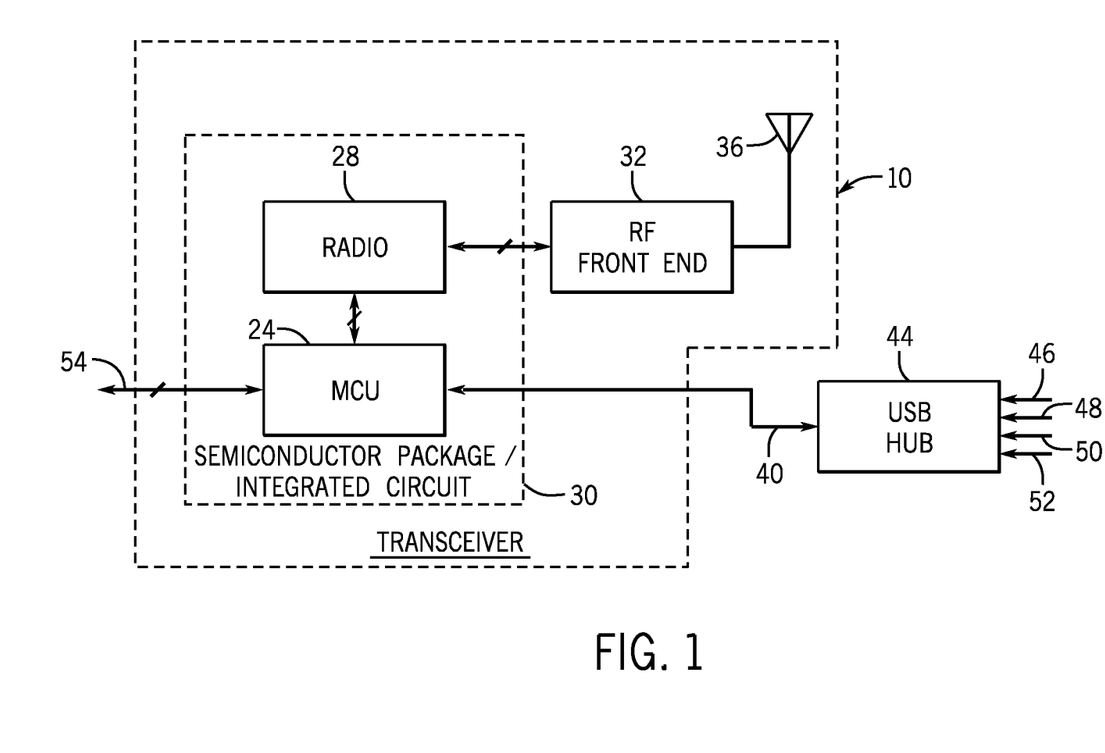
FIG. 1 is a schematic diagram of a transceiver system according to an exemplary embodiment.

Referring to FIG. 1, in accordance with embodiments disclosed herein, an embedded microcontroller unit (MCU) 24 may be used in a variety of applications, such as applications in which the MCU 24 controls various aspects of a transceiver 10 (as a non-limiting example). In this regard, the MCU 24, for this particular example, may be part of an integrated circuit (IC), or semiconductor package 30, which also includes a radio 28. As a non-limiting example, the MCU 24 and the radio 28 may collectively form a packet radio, which processes incoming and outgoing streams of packet data. To this end, the transceiver 10 may further include a radio frequency (RF) front end 32 and an antenna 36, which receives and transmits RF signals (frequency modulated (FM) signals, for example) that are modulated with the packet data.

As non-limiting examples, the transceiver 10 may be used in a variety of applications that involve communicating packet stream data over relatively low power RF links and as such, may be used in wireless point of sale devices, imaging devices, computer peripherals, cellular telephone devices, etc. As a specific non-limiting example, the transceiver 10 may be employed in a smart power meter which, through a low power RF link, communicates data indicative of power consumed by a particular load (a residential load, for example) to a network that is connected to a utility. In this manner, the transceiver 10 may transmit packet data indicative of power consumed by the load to mobile meter readers as well as to an RF-to-cellular bridge, for example. Besides transmitting data, the transceiver 10 may also receive data from the utility or meter reader for such purposes (as non-limiting examples) as inquiring as to the status of various power consuming devices or equipment; controlling functions of the smart power meter; communicating a message to a person associated with the monitored load, etc.

As depicted in FIG. 1, in addition to communicating with the radio 28, the MCU 24 may further communicate with other devices and in this regard may, as examples, communicate over communication lines 54 with a current monitoring and/or voltage monitoring device of the smart power meter as well as communicate with devices over a serial bus 40. In this manner, the serial bus 40 may include data lines that communicate clocked data signals, and the data may be communicated over the serial bus 40 data in non-uniform bursts. As a non-limiting example, the serial bus may be a Universal Serial Bus (USB) 40, as depicted in FIG. 1, in accordance with some embodiments of the invention. In addition to containing lines to communicate data, the serial bus, such as the USB 40, may further include a power line (a 5 volt power line, for example) for purposes of providing power to serial bus devices, such as the MCU 24. Various USB links 46, 48, 50 and 52 may communicate via a hub 44 and USB 40 with the transceiver 10 for such purposes as communicating with a residential computer regarding power usage of various appliances, communicating with these appliances to determine their power usages, communicating with the appliances to regulate their power usages, etc.

Figure 2:
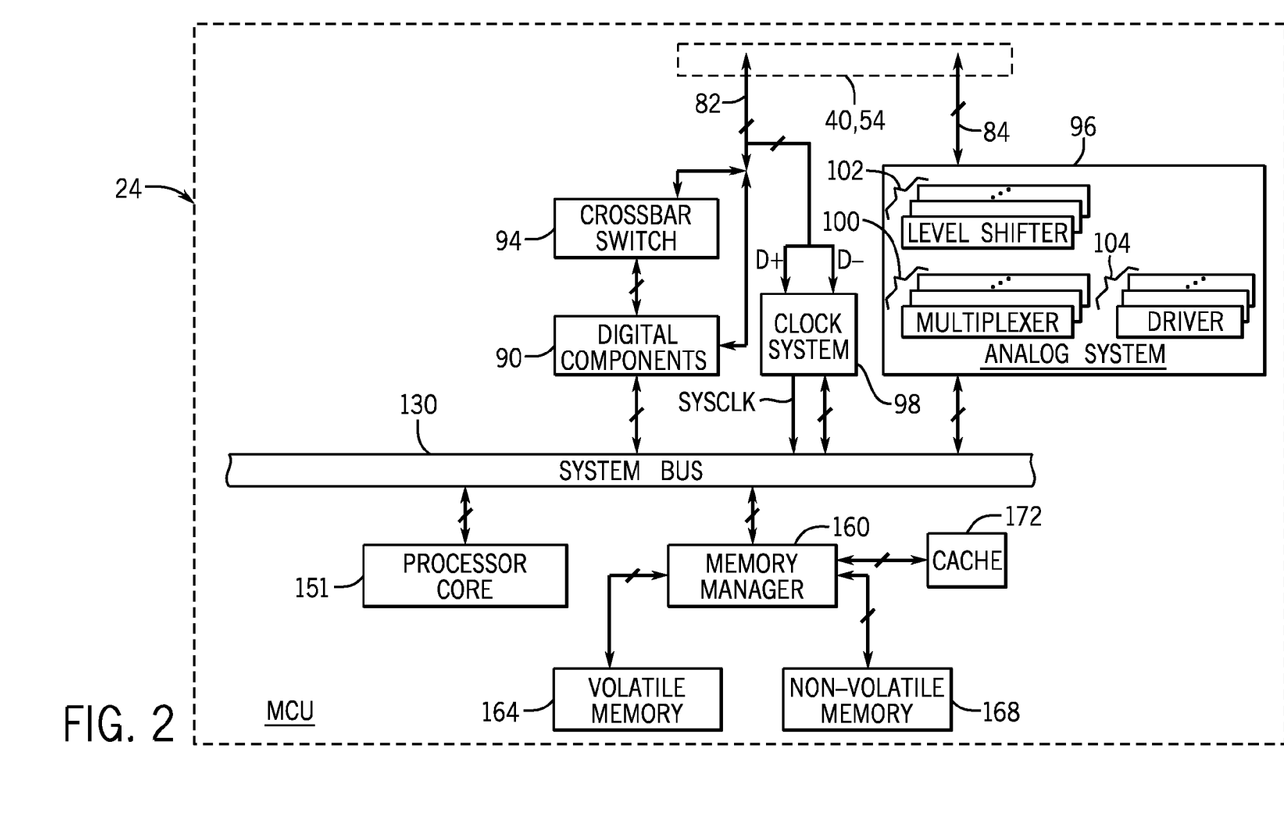
FIG. 2 is a schematic diagram of a microcontroller unit of the system of FIG. 1 according to an exemplary embodiment.

Referring to FIG. 2, in accordance with embodiments, the MCU 24 includes a processor core 151 (i.e., a "processor"). Depending on the particular embodiment, the MCU 24 may not contain any of the components depicted in FIG. 2 other than the processor core 151; may contain one or more of the components that are depicted in FIG. 2 in addition to the processor core 151; may contain other and/or additional components than the components that are depicted in FIG. 2; and so forth. Thus, many embodiments are contemplated, which are within the scope of the appended claims. As a non-limiting example, the processor core 151 may be a 32-bit core, such as the Advanced RISC Machine (ARM) processor core, which executes a Reduced Instruction Set Computer (RISC) instruction set. In general, the processor core 151 communicates with various other system components of the MCU 24, such as a memory controller, or manager 160, over a system bus 130. In general, the memory manager 160 controls access to various memory components of the MCU 24, such as a cache 172, a non-volatile memory 168 (a Flash memory, for example) and a volatile memory 164 (a static random access memory (SRAM), for example).

For purposes of producing clock signals for use by the components of the MCU 24, such as the processor core 151, the MCU 24 includes a clock system 98. As depicted in FIG. 2, for purposes of an example, the clock system 98 is depicted as providing a system clock signal called "SYSCLK" in FIG. 2 to the system bus 130. In general, the clock system 98 recovers a clock signal used in the communication of bursty data on data lines (labeled as the "D+" and "D−" in FIG. 2) over the USB 40 and may use this recovered clock signal as the system clock signal.

The MCU 24 may include various digital peripheral components 90, such as (as non-limiting examples) a programmable counter/timer array (PCA), a universal asynchronous receiver/transmitter (UART), a system management bus (SMB) interface, a serial peripheral interface (SPI), etc. The MCU unit 24 may include a crossbar switch 94, which permits the programmable assigning of the digital peripheral components 90 to digital output terminals 82 of the MCU 24. In this regard, the MCU 24 may be selectively configured to selectively assign certain output terminals 82 to the digital peripheral components 90.

In accordance with embodiments, the MCU 24 includes an analog system 96, which communicates analog signals on external analog terminals 84 of the MCU 24 and generally forms the MCU's analog interface. As an example, the analog system 96 may include various components that receive analog signals, such as analog-to-digital converters (ADCs), comparators, etc.; and the analog system 96 may include components (supply regulators, for example) that furnish analog signals (power supply voltages, for example) to the terminals 84, as well as other components, such as current drivers.

Figure 3:
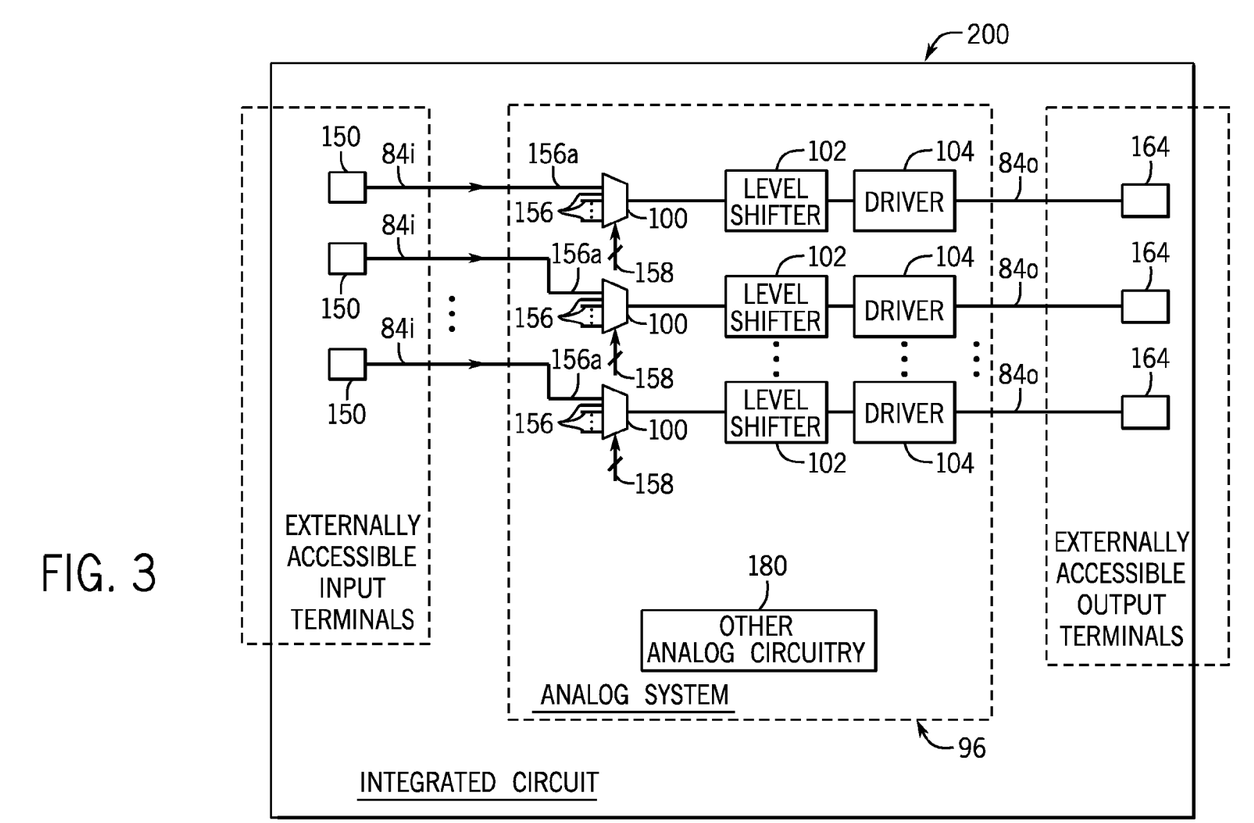
FIG. 3 is a schematic diagram of an analog system of the microcontroller unit of FIG. 2 according to an exemplary embodiment.

FIG. 3 depicts the analog system 96, in accordance with an exemplary embodiment. As depicted in FIG. 3, the analog system 96 may be fabricated as part of an integrated circuit 200. As a non-limiting example, the integrated circuit 200 may contain at least one die, which contains the analog system 96. In some embodiments, the analog system 96 may be fabricated on the same die as other components of the MCU 24. For example, in accordance with some embodiments, the analog system 96 may be fabricated with the processor core 151 (see FIG. 2) on the same die and as such, the processor core 151 and analog system 96 may be part of the integrated circuit 200. In some embodiments, the analog system 96, as well as most if not all of the components that are depicted in FIG. 2, such as the processor core 151, may be fabricated on the same die as the analog system 96. In accordance with exemplary embodiments, the analog system 96 and the processor core 151 are part of the same integrated circuit. It is noted that, depending on the particular embodiment, the integrated circuit may contain multiple dies (a multi-chip module, for example), and the analog system 96 may be fabricated on the same die or on separate dies of the integrated circuit.

In accordance with an exemplary embodiment, the analog system 96 includes level shifters 102, which selectively level shift signals that are received at externally accessible input terminals 150 (hereinafter referred to as the "external input terminals 150") of the integrated circuit 200 to provide corresponding level-shifted signals at external output terminals 164 of the integrated circuit 200. In accordance with exemplary embodiments, the level shifters 102 are constructed to level shift their respective signals from lower voltage magnitudes, or levels, to higher voltage levels. For example, a given external input terminal 150 may receive a signal that is associated with a relatively low voltage subsystem of the transceiver 10 (see FIG. 1). However, this lower voltage subsystem may communicate with a relatively higher voltage subsystem of the transceiver 10. For this purpose, the relatively low voltage signals from the low voltage subsystem may be routed through the integrated circuit 200 for purposes of level shifting the signals to generate corresponding signals for the relatively high voltage subsystems.

The level shifter 102 may have one of numerous designs to up shift an input voltage level to a relatively higher output voltage level. As a non-limiting example, the level shifter 102 may include a differential amplifier that receives the relatively lower level input voltage at an input terminal of the differential amplifier and provides (at its output) a relatively higher level output voltage, which may be buffered to produce the output signal for the level shifter. Other topologies for the level shifter 102 may be employed, in accordance with other embodiments. Moreover, the level shifter 102 may, in general, shift between any of a number of different voltage levels, such as shifting between different complementary metal oxide semiconductor (CMOS) logic levels, shifting between CMOS and transistor-transistor logic (TTL) levels, shifting between CMOS voltage logic levels and logic levels used on a bus interface, and so forth, as can be appreciated by the skilled artisan.

As a more specific example, a given signal that is received at the external input terminal 150 may be a logic signal that is associated with two binary states: a first state indicated by a logic one voltage of the signal and a second state indicated by a logic zero voltage of the signal. For purposes of example, the logic zero voltage may correspond to a voltage level of 0 to 1.9 volts (V), and the logic one voltage may correspond to a voltage of 1.9 to 3.8V. The received logic signal may be generated by a relatively low voltage subsystem that has a 3.8 V supply voltage uses the logic signal in communication with a relatively high voltage subsystem, which has a supply voltage of 5 V. In this manner, the relatively high voltage subsystem may use logic signals that have logic zero and logic one states that correspond to voltage level ranges of 0 to 2.5 V and 2.5 to 5 V, respectively. Routing the logic signal from the relatively low voltage system through the analog system 96 of the MCU 24 allows the analog system 96 to level shift the logic signal for purposes of allowing communication between the low and high voltage systems. Thus, the analog interface 96, for example, level shifts the 3.8 V levels to the 5 V levels.

Among the other components of the analog system 96, the analog system 96 may include other analog circuitry 180, such as, for example, level shifters, which are used to level shift signals for internal components of the analog system 96, analog-to-digital converters (ADCs), and so forth.

For the specific example that is depicted in FIG. 3, the analog system 96 includes a set of external input terminals 150 to receive relatively low voltage logic signals and a set of externally accessible output terminals 164 thereinafter referred to as the "external output terminals 164") to provide relatively high voltage logic signals. In this manner, in accordance with some embodiments, circuitry that includes a multiplexer 100, a level shifter 102 and a driver 104 is serially coupled together between a respective external input terminal 150 and a respective external output terminal 164. More specifically, for a given external input terminal 150, the terminal 150 is coupled to a particular input terminal (such as input terminal 156a, for example) of a set of multiple input terminals 156 of the multiplexer 100. The multiplexer 100, in turn, selects a particular input signal of the multiplexer 100 for level shifting, as controlled by a selection control signal 158 (a single bit or a multiple bit control signal, for example) that is received at the select terminal of the multiplexer 100. Thus, when the select signal 158 selects the input terminal 156a, the multiplexer 100 couples the external input terminal 150, the level shifter 102 and the output terminal 164 together.

As depicted in FIG. 3, in accordance with some embodiments, the output terminal of the level shifter 102 is coupled to a driver 104, which drives a signal on the external output terminal 164. Therefore, when the multiplexer 100 is configured to select the input terminal 156a, the signal that is received at the external input terminal 150 is level shifted (by level shifter 102) and driven onto the external output terminal 164 by the driver 104.

As depicted in FIG. 3, the multiplexer 100 may select other signals to be level shifted and driven onto the output terminal 164. For example, these other signals may include signals from one of the internal digital components 90 (see FIG. 2) of the MCU 24, such as a programmable counter array (PCA) component, a serial peripheral interface (SPI) component, a universal asynchronous receiver/transmitter (UART) component, and so forth.

Figure 4:
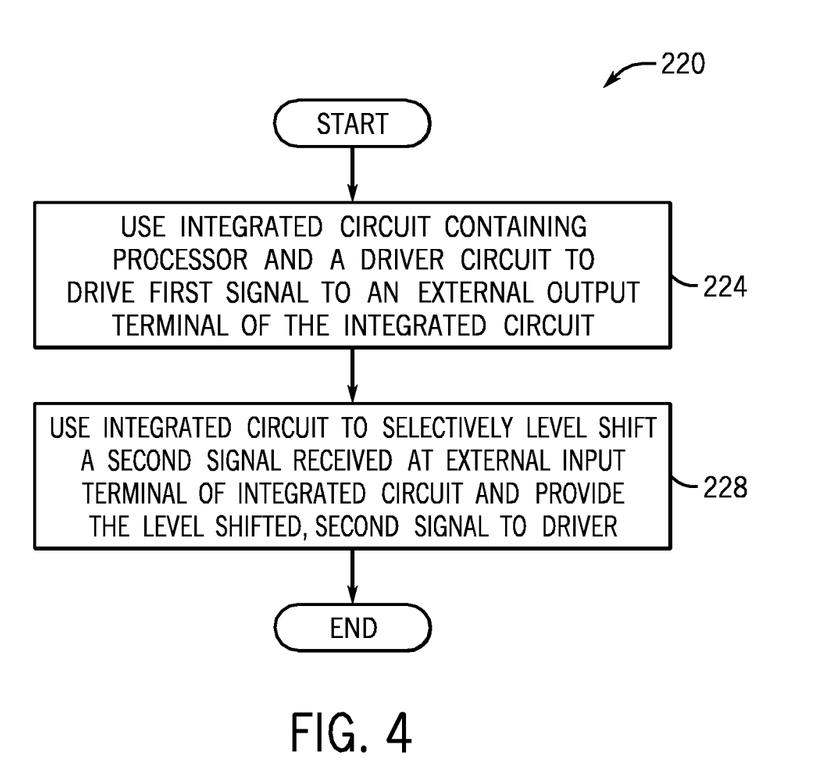
FIG. 4 is a flow diagram depicting a technique employed by the analog system of FIG. 3 to level shift a signal according to an exemplary embodiment.

Thus, a technique 220 in accordance with exemplary embodiments includes using (block 224) an integrated circuit that contains a processor and a driver circuit to drive a first signal to an external output terminal of the integrated circuit. The technique 220 includes using (block 228) the integrated circuit to selectively level shift a second signal, which is received at an external input terminal of the integrated circuit and provide the level shifted, second signal to the driver.

Figure 5:
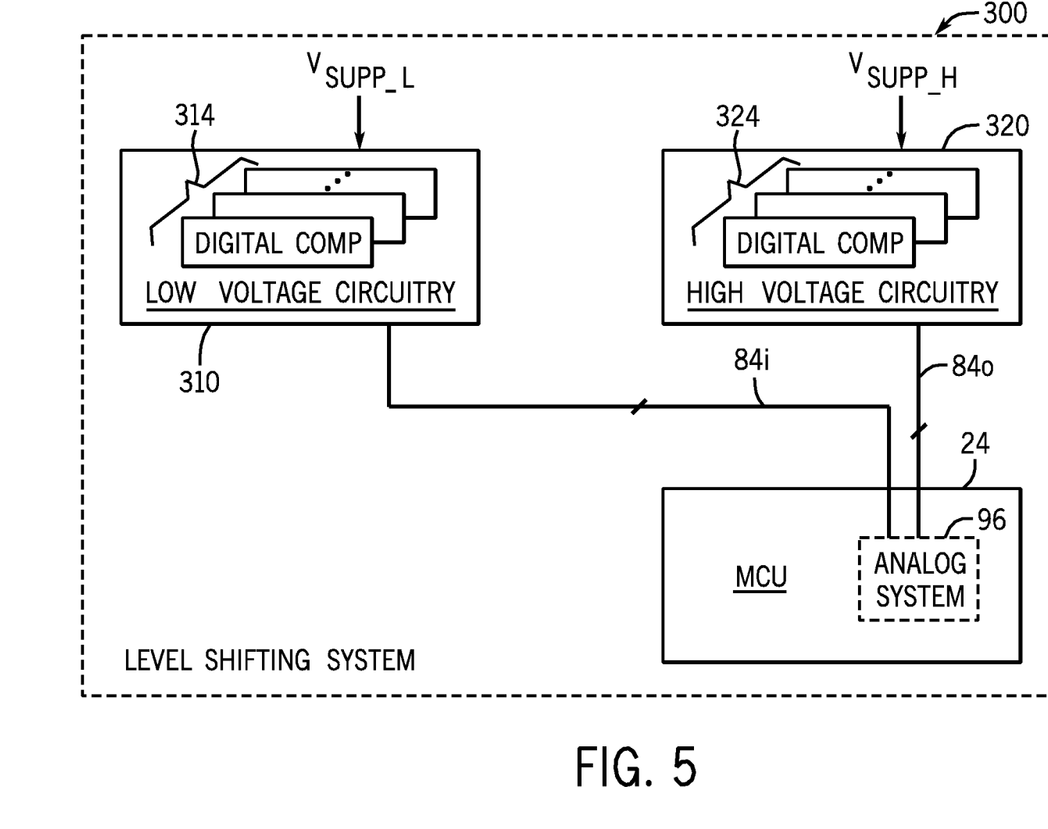
FIG. 5 is a schematic diagram of a level shifting system according to an exemplary embodiment.

FIG. 5 depicts an exemplary level shifting system 300, in accordance with exemplary embodiments. In general, the level shifting system 300 includes the MCU 24 and its analog system 96, which performs level shifting between relatively low voltage circuitry 310 and relatively high voltage circuitry 320. In this manner, the low voltage circuitry 310 may operate from a relatively lower voltage power supply (called "$V_{SUPP\_L}$," in FIG. 5), which may be, as a non-limiting example, 3.8 V. In contrast, the high voltage circuitry 320 may be supplied by a supply voltage (called "$V_{SUPP\_H}$," in FIG. 5), which, as a non-limiting example, may be 5 V. As such, digital components 314 of the low voltage circuitry 310 may use logic signals associated with relatively low logic one states, as compared to logic signals used by digital components 324 of the high voltage circuitry 320, which employ the use of relatively high voltage logic signals. However, the signals from the low voltage circuitry 314 are routed (via the communication lines 84i) to the analog system 96, where the analog signal 96 level shifts the signals to produce corresponding level shifted, higher voltage signals that are communicated on the communication lines 84o to the high voltage circuitry 320.

While a limited number of embodiments have been disclosed herein, those skilled in the art, having the benefit of this disclosure, will appreciate numerous modifications and variations therefrom. It is intended that the appended claims cover all such modifications and variations.

What is claimed is:

1. A method comprising:
   providing an integrated circuit comprising a processor and a driver circuit to drive a first signal to an externally accessible output terminal of the integrated circuit;
   adapting the integrated circuit to selectively level shift a second signal received at an externally accessible input terminal of the integrated circuit to provide a level shifted second signal to the driver; and
   adapting the integrated circuit to selectively level shift a third signal generated by a component of the integrated circuit and provide the level shifted third signal to the driver.

2. The method of claim 1, wherein the externally accessible output terminal is associated with a first voltage level, and the externally accessible input terminal is associated with a second voltage level less than the first voltage level.

3. The method of claim 1, wherein the first signal and the level shifted second signal comprise clock signals.

4. The method of claim 1, wherein the adapting the integrated circuit to selectively shift the second signal comprises adapting the integrated circuit to selectively level shift a signal provided by a digital component external to the integrated circuit.

5. The method of claim 4, wherein the digital component comprises at least one of the following: a programmable counter array (PCA) component, a serial peripheral interface (SPI) component and a universal asynchronous receiver/transmitter (UART) component.

6. The method of claim 1, wherein
   adapting the integrated circuit to selectively shift the second signal comprises adapting the integrated circuit to selectively level shift a signal provided by a first circuit external to the integrated circuit, the first circuit being powered by a first supply voltage; and
   providing the integrated circuit to drive the first signal comprises adapting the integrated circuit to drive a signal for a second circuit external to the integrated circuit, the second circuit being powered by a second supply voltage being greater than the first supply voltage.

7. The method of claim 1, further comprising:
   using the driver to control at least one of a slew rate and a maximum current of the first signal.

8. An apparatus comprising:
   an integrated circuit comprising a plurality of input terminals, a plurality of second terminals to communicate with circuitry external to the integrated circuit, a plurality of multiplexers, a plurality of level shifters, and a processor;
   wherein the plurality of multiplexers are adapted to selectively couple the input terminals, the level shifters and the second terminals together.

9. The apparatus of claim 8, wherein a given second terminal of the plurality of second terminals is associated with a first voltage level, a given input terminal of the plurality of terminals is associated with a second voltage level less than the first voltage level, and a given level shifter of the plurality of level shifters is adapted to shift an input voltage to the given level shifter associated with the second voltage level to an output voltage of the given level shifter associated with the first voltage level.

10. The apparatus of claim 8, wherein the integrated circuit further comprises a driver to drive a given second terminal of the plurality of second terminals, and a given multiplexer of the plurality of multiplexers is adapted to selectively couple the driver to a given input terminal of the plurality of input terminals.

11. The apparatus of claim 10, wherein the driver is adapted to control at least one of a slew rate and a maximum current of a signal provided to the given second terminal.

12. The apparatus of claim 8, wherein the integrated circuit further comprises a digital component to generate a signal, and a given multiplexer of the plurality of multiplexers is further adapted to selectively couple the signal to a given level shifter of the plurality of level shifters.

13. The apparatus of claim 12, wherein the digital component comprises at least one of the following: a programmable counter array (PCA) component, a serial peripheral interface (SPI) component and a universal asynchronous receiver/transmitter (DART) component.

14. An apparatus comprising:
an integrated circuit comprising an input terminal, a second terminal to communicate with circuitry external to the integrated circuit, a multiplexer, a level shifter, and a processor;
wherein the processor is adapted to selectively configure the multiplexer to couple the input terminal, the level shifter and the second terminal together based at least in part on at least one user supplied configuration setting.

15. The apparatus of claim 14, wherein the second terminal is associated with a first voltage level, the input terminal is associated with a second voltage level less than the first voltage level, and the level shifter is adapted to shift an input voltage to the level shifter associated with the second voltage level to an output voltage of the level shifter associated with the first voltage level.

16. The apparatus of claim 14, wherein the integrated circuit further comprises a driver to drive the second terminal, and the multiplexer is further adapted to selectively couple the driver to the input terminal.

17. The apparatus of claim 14, wherein
the integrated circuit further comprises a plurality input terminals comprising the input terminal, a plurality of second terminals comprising the second terminal, a plurality of level shifters comprising the level shifter; and
the processor is adapted to selectively configure the plurality of multiplexers to selectively couple the input terminals, the level shifters and the second terminals together.

\* \* \* \* \*

UNITED STATES PATENT AND TRADEMARK OFFICE
CERTIFICATE OF CORRECTION

Page 1 of 1

PATENT NO. : 8,618,844 B2
APPLICATION NO. : 13/404744
DATED : December 31, 2013
INVENTOR(S) : Thomas S. David and Paul I. Zavalney It is certified that error appears in the above-identified patent and that said Letters Patent is hereby corrected as shown below:

In the Claims:

Col. 7, Line 13:
"(DART)" should be --(UART)--.

Signed and Sealed this
Eighteenth Day of March, 2014

Michelle K. Lee
*Deputy Director of the United States Patent and Trademark Office*